United States Patent
Kim

(10) Patent No.: US 8,565,813 B2
(45) Date of Patent: Oct. 22, 2013

(54) APPARATUS AND METHOD FOR AMPLIFYING POWER IN MOBILE TERMINAL

(75) Inventor: Young-Seok Kim, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 126 days.

(21) Appl. No.: 13/150,523

(22) Filed: Jun. 1, 2011

(65) Prior Publication Data

US 2011/0294540 A1 Dec. 1, 2011

(30) Foreign Application Priority Data

Jun. 1, 2010 (KR) .................. 10-2010-0051808

(51) Int. Cl.
*H04W 88/06* (2009.01)
(52) U.S. Cl.
USPC .................................. 455/552.1; 455/127.1

(58) Field of Classification Search
USPC .............. 455/126, 127.1, 127.3, 343.1, 552.1
See application file for complete search history.

(56) References Cited

U.S. PATENT DOCUMENTS

2011/0230149 A1* 9/2011 Kuriyama et al. .......... 455/127.1
2012/0115456 A1* 5/2012 Krishnan et al. .............. 455/418

* cited by examiner

*Primary Examiner* — Sam Bhattacharya
(74) *Attorney, Agent, or Firm* — Cha & Reiter, LLC

(57) ABSTRACT

A transmission apparatus and a method thereof in a mobile terminal are provided. More particularly, an apparatus and a method for securing a space of a mobile terminal and reducing manufacturing costs by integrating power amplifying units into one module in the mobile terminal that supports a multi-mode are provided. The power amplifier of a mobile terminal includes a first amplifying unit and a second amplifying unit. The first amplifying unit defines a frequency of a GSM quad band as a low frequency band and a high frequency band, and then amplifies a signal of the low frequency band of the GSM quad band. The second amplifying unit amplifies a signal of the high frequency band of the GSM quad band and a signal of a TD-SCDMA band.

18 Claims, 2 Drawing Sheets

APPARATUS AND METHOD FOR AMPLIFYING POWER IN MOBILE TERMINAL

CLAIM OF PRIORITY

This application claims the benefit under 35 U.S.C. §119 from a Korean patent application filed in the Korean Intellectual Property Office on Jun. 1, 2010 and assigned Serial No. 10-2010-0051808, the entire disclosure of which is hereby incorporated by reference in its entirety.

BACKGROUND OF THE INVENTION

1. Field of the Invention

The present invention relates to a transmission apparatus and a method thereof in a mobile terminal. More particularly, the present invention relates to an apparatus and a method for securing a space of a mobile terminal that supports a multi-mode and reducing manufacturing costs.

2. Description of the Related Art

Generally, a mobile terminal that supports a multi-mode separately includes power amplifying units corresponding to supported modes and an antenna switching module. In other words, in the case where the mobile terminal supports a GSM (Global System for Mobile communication) quad band and a TD-SCDMA (Time Division-Synchronous Code Division Multiple Access) band, the mobile terminal includes one power amplifying unit corresponding to the GSM quad band and another power amplifying unit corresponding to the TD-SCDMA band and an antenna switching module.

Many efforts are being made to reduce the size of the mobile terminal for the purpose of portability, but due to the above-described structural constraints, a size reduction of current mobile terminal is challenging and manufacturing costs of the mobile terminal increases as a separate power amplifying unit corresponding to a supported mode must be provided.

To solve the above-described problem, a structure of integrating an antenna switching module and power amplifying units has been proposed, but the coupling between power amplifying units whose frequency bands are different has not been possible. Thus, the above-described problem continues to occur as the number of bands supported by the mobile terminal increases.

Accordingly, to solve the above problem, an apparatus and a method for coupling power amplifying units corresponding to bands supported by the mobile terminal are desired in current miniaturization efforts.

SUMMARY OF THE INVENTION

An exemplary aspect of the present invention is to provide an apparatus and a method for reducing manufacturing costs and a size of a mobile terminal.

Another exemplary aspect of the present invention is to provide an apparatus and a method for integrating power amplifying units corresponding to frequency bands and a switching module into one module in a mobile terminal.

Still another exemplary aspect of the present invention is to provide an apparatus and a method for discriminating between a power amplifying unit corresponding to a high frequency band and a power amplifying unit corresponding to a low frequency band in a mobile terminal.

In accordance with an exemplary aspect of the present invention, a power amplifier of a mobile terminal includes a first amplifying unit for defining a frequency of a GSM quad band as a low frequency band and a high frequency band, and then amplifying a signal of the low frequency band of the GSM quad band, and a second amplifying unit for amplifying a signal of a high frequency band of the GSM quad band and a signal of a TD-SCDMA band.

In accordance with another exemplary aspect of the present invention, a method for amplifying power of a mobile terminal includes defining a frequency of a GSM quad band as a low frequency band and a high frequency band, amplifying a signal of the low frequency band of the GSM quad band using a first amplifying unit, and amplifying a signal of the high frequency band of the GSM quad band and a signal of a TD-SCDMA band using a second amplifying unit.

In accordance with still another exemplary aspect of the present invention, a power amplifying apparatus of a mobile terminal includes an input port for providing a signal of a low frequency band, a plurality of input ports for providing a signal of a high frequency band, a first amplifying unit for amplifying a signal of the low frequency band, a second amplifying unit for amplifying a signal of the high frequency band, a band switching unit for controlling a path between the input port and the second amplifying unit depending on an input signal of the high frequency band, and a TD-SCDMA control switching unit for controlling a path between matching circuits depending on a received high frequency signal, wherein the signal of the low frequency band comprises a signal of a low frequency band of a GSM quad band, and the signal of the high frequency band comprises a signal of a high frequency band of the GSM quad band and a signal of a TD-SCDMA band.

Other exemplary aspects, advantages and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other exemplary aspects, features and advantages of certain exemplary embodiments of the present invention will become more apparent to a person of ordinary skill in the art from the following description taken in conjunction with the accompanying drawings in which.

Throughout the drawings, like reference numerals will be understood to refer to like parts, components and structures.

DETAILED DESCRIPTION

The following description, with reference to the accompanying drawings, is provided to assist a person of ordinary skill in the art with a comprehensive understanding of certain exemplary embodiments of the invention provided herein for illustrative purposes. For the purposes of clarity and simplicity, descriptions of well-known functions and constructions may be omitted as their inclusion may obscure appreciation of the subject matter of the claimed invention by a person of ordinary skill in the art.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustrative purposes only and is not to be construed as limiting the invention as defined by the appended claims and their equivalents.

It is to be understood that the singular forms "a," "an," and "the" include plural references unless the context clearly dictates otherwise. Thus, for example, a reference to "a component surface" includes reference to one or more of such surfaces.

By the term "substantially" it is typically meant that the recited characteristic, parameter, or value need not be achieved exactly, but that deviations or variations, including but in no way limited to, for example, tolerances, measurement error, measurement accuracy limitations and other factors known to persons of ordinary skill in the art, may occur in amounts that do not preclude the effect the characteristic was intended to provide.

Figure 1:
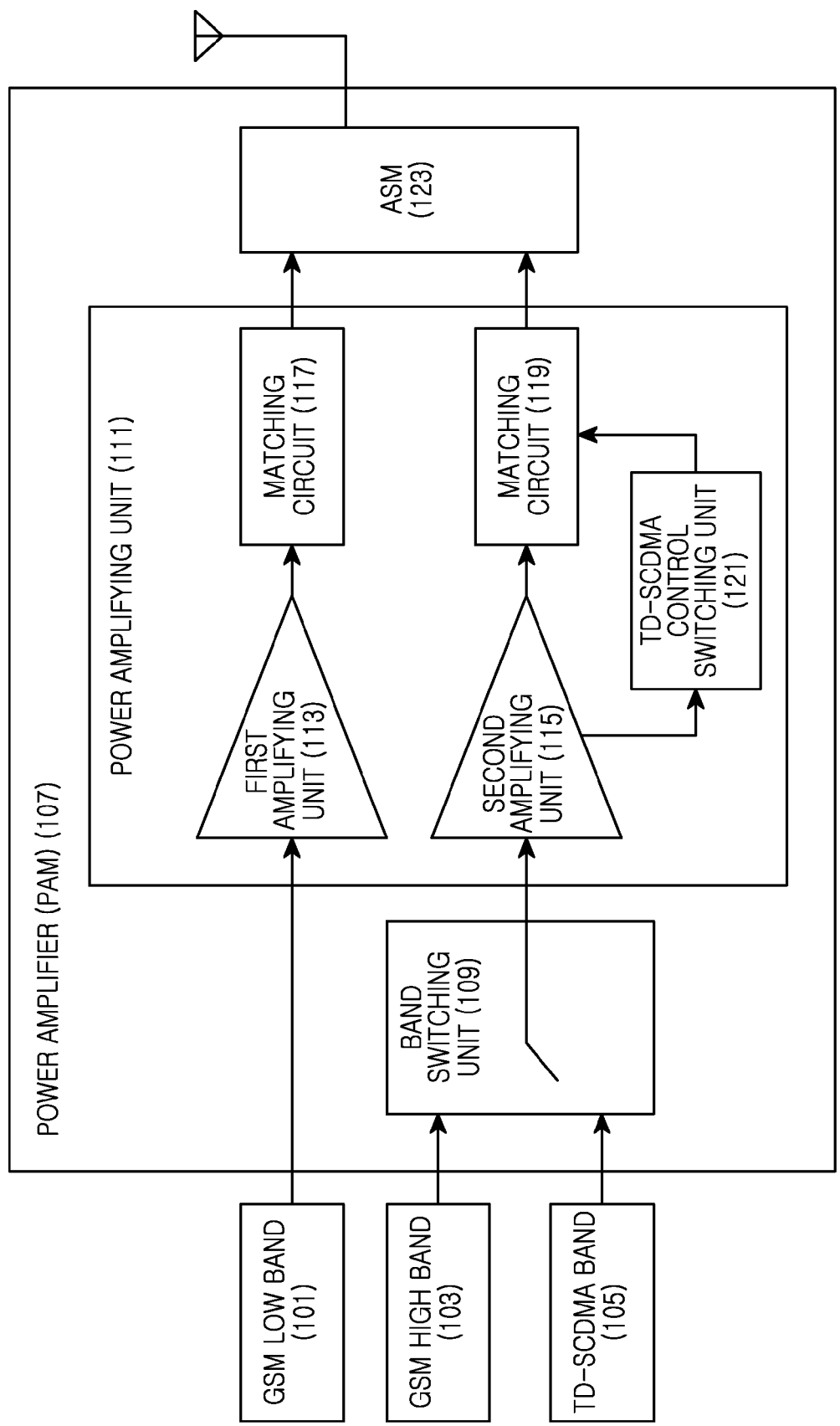
FIG. 1 is a block diagram illustrating a construction of a power amplifier of a mobile terminal according to an exemplary embodiment of the present invention.

FIG. 1 is a block diagram illustrating a construction of a power amplifier of a mobile terminal according to an exemplary embodiment of the present invention.

Referring to FIG. 1, the power amplifier of the mobile terminal may integrate a band switching unit 109, a power amplifying unit 111, and an antenna switching module 123 into one module. In addition, like the conventional mobile terminal, the power amplifier 107 may include three input ports (a GSM low frequency band input port 101, a GSM high frequency band input port 103, and a TD-SCDMA band input port 105) for receiving outputs of a TD-SCDMA band transceiver and a GSM quad band transceiver. The power amplifying unit 111 may include a first amplifying unit 113, a second amplifying unit 115, matching circuits 117 and 119 coupled to the first and second amplifying units 113 and 115, and a TD-SCDMA control switching unit 121.

In the embodiment, the GSM low frequency band input port 101 outputs baseband signals in frequency bands of 850 and 900 MHz among a GSM quad band to the first amplifying unit 113. The GSM high frequency band input port 103 outputs baseband signals in frequency bands of 1800 and 1900 MHz among the GSM quad band to the second amplifying unit 115.

In addition, the TD-SCDMA band input port 105 outputs baseband signals in frequency bands of 1880~1920 and 2010~2025 MHz of a TD-SCDMA band to the second amplifying unit 115. According to an exemplary embodiment of the present invention, the TD-SCDMA band input port 105 outputs signals to the second amplifying unit 115 like the GSM high frequency band input port 103 as the frequency band of the TD-SCDMA band and the frequency bands of 1800 and 1900 MHz of the GSM quad band are similar.

According to an exemplary embodiment of the present invention, the power amplifier 107 integrates a power amplifying unit for the TD-SCDMA band, a power amplifying unit for the GSM quad band, and the antenna switching module 123 into one module in order to secure a space and reduce manufacturing costs of a mobile terminal. To this end, the band switching unit 109 of the power amplifier 107 switches output paths of the TD-SCDMA band input port 105 and the GSM high frequency input port 103. When detecting a signal output from the TD-SCDMA band input port 105, the band switching unit 109 connects the TD-SCDMA band input port 105 with the second amplifying unit 115. Conversely, when detecting a signal output from the GSM high frequency input port 103, the band switching unit 109 connects the GSM high frequency input port 103 with the second amplifying unit 115.

The first amplifying unit 113 is connected with the GSM low frequency band input port 101 to amplify baseband signals in the frequency bands of 850 and 900 MHz among the GSM quad band. The second amplifying unit 115 is connected with the GSM high frequency band input port 103 or the TD-SCDMA band input port 105 to amplify baseband signals in the high frequency band.

The amplifying units 113 and 115 transmit the amplified baseband signals to the matching circuits 117 and 119 connected with corresponding amplifying units 113 and 115, respectively. The matching circuits 117 and 119 that have received the amplified baseband signals match to output power suitable for frequency bands corresponding to the respective input ports. Thus, the power amplifying unit 111, in operation, converts a small signal output from the input port into a larger signal and outputs the same. That is, the power amplifying unit 111 amplifies a signal output to each input port and matches a signal corresponding to the input port.

According to an exemplary embodiment of the present invention, the TD-SCDMA control switching unit 121 changes a matching path of the TD-SCDMA band signal since the high frequency band of the GSM quad band and a signal of the TD-SCDMA frequency band pass through the same matching circuit 119 via the second amplifying unit 115, and the maximum output powers of the high frequency band of the GSM quad band and a signal of the TD-SCDMA band are different.

The TD-SCDMA control switching unit 121 selects a matching path between a signal in the high frequency band of the GSM quad band and a signal in the TD-SCDMA band. The TD-SCDMA control switching unit 121 selects the matching path by controlling a matching circuit 119. The matching circuit 119 may include a diode (not shown) such as a varacter diode. In this case, the TD-SCDMA control switching unit 121 may select the matching path by directly controlling the diode in the matching circuit 119.

For example, when receiving a high frequency band signal of the GSM quad band, the diode is allowed to operate in an off-state by the TD-SCDMA control switching unit 121, so that the matching circuit 119 serves as a matching circuit for the GSM high frequency band signal.

Conversely, when receiving a signal in the frequency band of the TD-SCDMA, the diode is allowed to operate in an on-state by the TD-SCDMA control switching unit 121, so that the matching circuit 119 serves as a matching circuit for the signal in the TD-SCDMA band. That is, the output of matching circuit is changed by the state of diode.

The antenna switching module 123 selects a low frequency band signal and a high frequency band signal output from the power amplifying unit 111 and sends the selected signal to an antenna. The antenna radiates the signal selected by the antenna switching module 123 to air.

Figure 2:
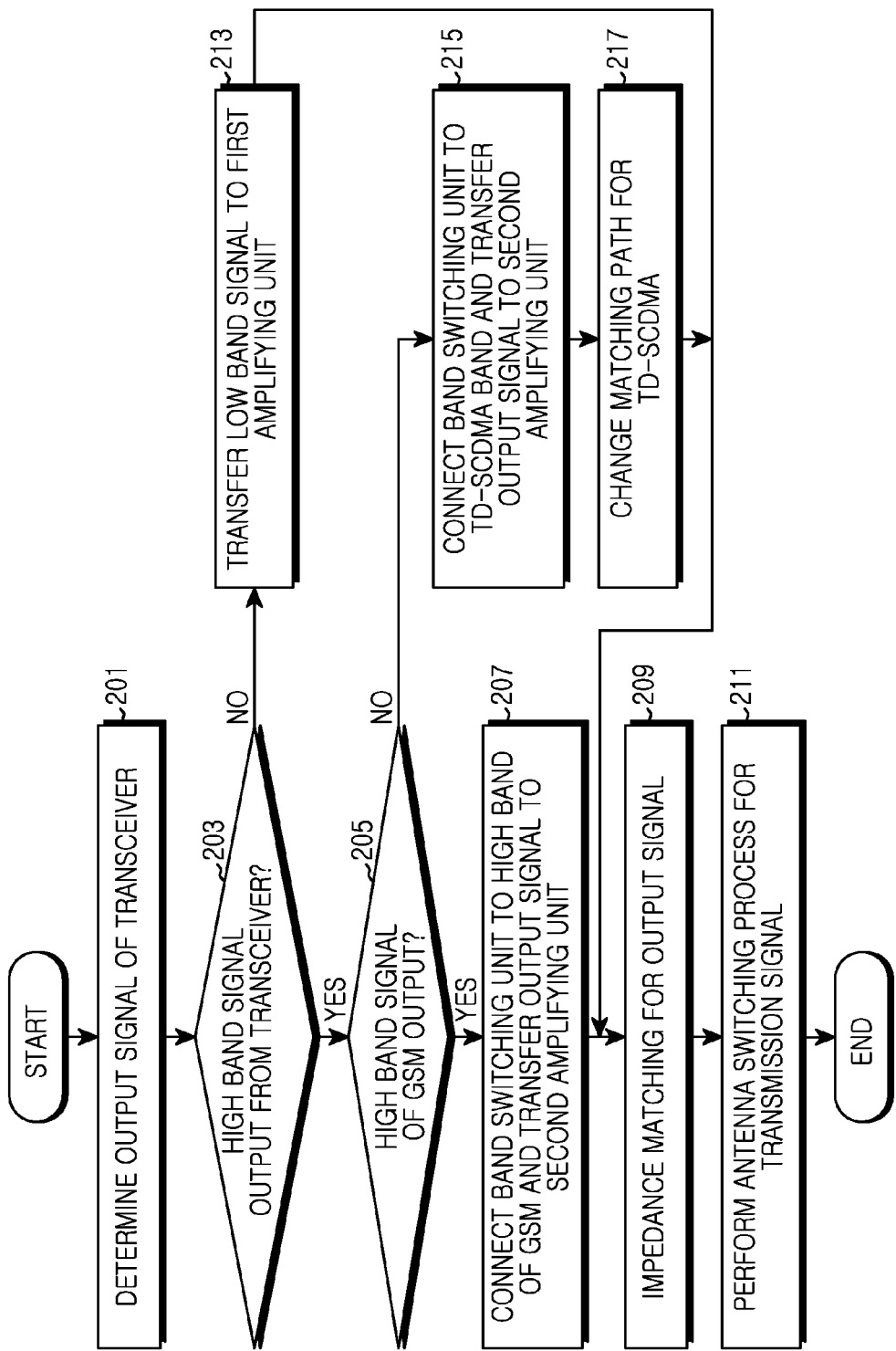
FIG. 2 is a flowchart illustrating a data transmission process of a mobile terminal according to an exemplary embodiment of the present invention.

FIG. 2 is a flowchart illustrating a data transmission process of a mobile terminal according to an exemplary embodiment of the present invention.

Referring to FIG. 2, the mobile terminal serves as a mobile terminal that supports a TD-SCDMA band and a GSM quad band. According to an exemplary embodiment of the present invention, the mobile terminal uses a power amplifier that integrates power amplifying units for amplifying a signal of each band and an antenna switching module into one module.

In operation, the mobile terminal determines an output signal of a transceiver and determines a frequency band corresponding to a signal for data transmission in step 201.

The GSM quad band supports frequency bands of 850, 900, 1800, and 1900 MHz, and the TD-SCDMA band supports frequency bands of 1880~1920 and 2010~2025 MHz. Therefore, according to an exemplary embodiment of the present invention, the frequency bands may be classified into a low frequency band and a high frequency band. In other words, the low frequency band is defined as the frequency bands of 850 and 900 MHz of the GSM quad band, and the high frequency band is defined as the frequency bands of 1800 and 1900 MHz of the GSM quad band and the frequency bands of 1880~1920 and 2010~2025 MHz of the TD-SCDMA band. Note that the frequency band of the TD-SCDMA band is similar to the frequency bands of 1800 and 1900 MHz of the GSM quad band, so that a signal of the high frequency band from the respective band may be operably by the same amplifying unit.

When determining that a signal in the low frequency band is output from the transceiver in step 203, the mobile terminal proceeds to step 213 to transfer the output signal in the low frequency band to a first amplifying unit. Here, the first amplifying unit serves as an amplifying unit for amplifying a signal in the frequency bands of 850 and 900 MHz of the GSM quad band and corresponds to the conventional power amplifying unit.

In contrast, when determining that a signal in the high frequency band is output from the transceiver in step 203, the mobile terminal proceeds to step 205 to determine whether a signal in the high frequency band of the GSM quad band is output.

When determining that a signal in the high frequency band of the GSM quad band is output in step 205, the mobile terminal proceeds to step 207 to connect a band switching unit to the GSM high frequency band and transfer the output signal to a second amplifying unit.

In contrast, when determining that a signal in the TD-SCDMA band is output in step 205, the mobile terminal proceeds to step 215 to connect the band switching unit to the TD-SCDMA frequency band and transfer the output signal to the second amplifying unit, and then proceeds to step 217 to change a matching path for the TD-SCDMA.

Here, the second amplifying unit serves as an amplifying unit for amplifying a signal in the high frequency band, thus signals in the high frequency band of the GSM quad band and the frequency band of the TD-SCDMA use a path that passes through a matching circuit via the second amplifying unit. Since the maximum output powers of signals of the high frequency band of the GSM quad band and the TD-SCDMA band are different, the matching path is selectively changed according to the embodiment of the present invention, as described above, with respect to the signal of the TD-SCDMA band in order to address two different output powers.

When an output signal of the transceiver is transferred to the first amplifying unit and/or the second amplifying unit, the mobile terminal proceeds to step 209 to perform impedance matching for the output signal, and then proceeds to step 211 to perform an antenna switching process for a transmission signal.

The above-described methods according to the present invention can be implemented in hardware or as software or computer code that can be stored in a recording medium such as a CD ROM, an RAM, a floppy disk, a hard disk, or a magneto-optical disk or downloaded over a network and stored on a non-transitory machine readable medium, so that the methods described herein can be rendered in such software using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein.

As described above, one skilled in the art can readily appreciate that the teachings of the present invention provides schemes is for reducing manufacturing costs and a size of a mobile terminal. To this end, a power amplifying unit corresponding to a high frequency band and a power amplifying unit corresponding to a low frequency band are discriminated, and a signal in the GSM high frequency band and a signal in the TD-SCDMA band are provided to a common power amplifier for processing.

Although the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A power amplifier of a mobile terminal, comprising:
   a first amplifying unit for amplifying a signal of a low frequency band of a Global System for Mobile communication (GSM) quad band;
   a second amplifying unit for amplifying a first signal of a high frequency band of the GSM quad band and a second signal of a Time Division-Synchronous Code Division Multiple Access (TD-SCDMA) band; and
   a band switching unit, responsive to detection of the first signal or the second signal at an input port, for switching the first signal or the second signal to the second amplifying unit.

2. The power amplifier of claim 1, further comprising an antenna switching module for selectively outputting signals output from the first amplifying unit and the second amplifying unit.

3. The power amplifier of claim 1, wherein the band switching unit is coupled to the second amplifying unit to selectively couple to the input port of the high frequency band of the GSM quad band when a signal in the high frequency band of the GSM quad band is output therefrom or coupled to an input port of the TD-SCDMA band when a signal in the TD-SCDMA band is output therefrom.

4. The power amplifier of claim 1, further comprising a TD-SCDMA control switching unit for selecting a matching path between a signal in the high frequency band of the GSM quad band and a signal in the TD-SCDMA band.

5. The power amplifier of claim 4, wherein the matching path of the output signal in the high frequency band of the GSM quad band and the output signal in the TD-SCDMA band that are amplified by the second amplifying unit is selectively controlled, by the TD-SCDMA control switching unit, to be coupled to a matching circuit.

6. The power amplifier of claim 4, wherein the matching circuit includes a diode.

7. The power amplifier of claim 1, wherein the low frequency band comprises frequency bands of 850 and 900 MHz of the GSM quad band.

8. The power amplifier of claim 1, wherein the high frequency band comprises frequency bands of 1800 and 1900 MHz of the GSM quad band, and frequency bands of 1880 MHz-1920 and 2010 MHz-2025 MHz of the TD-SCDMA band.

9. A method for amplifying power of a mobile terminal, the method comprising:
 defining a frequency of a Global System for Mobile communication (GSM) quad band as a low frequency band and a high frequency band;
 amplifying a signal of the low frequency band of the GSM quad band using a first amplifying unit;
 detecting a first signal of the high frequency band of the GSM quad band and a second signal of a Time Division-Synchronous Code Division Multiple Access (TD-SCDMA) band at an input port;
 switching the first signal or the second signal to a second amplifying unit using a band switching unit; and
 amplifying the first signal or the second signal of the high frequency band using the second amplifying unit.

10. The method of claim 9, further transmitting output from the first amplifying unit and the second amplifying unit via an antenna.

11. The method of claim 9, wherein the switching of the first signal or the second signal comprises:
 coupling to an input port of the high frequency band of the GSM quad band with the second amplifying unit when a signal in the high frequency band of the GSM quad band is output therefrom; and
 coupling to an input port of the TD-SCDMA band with the second amplifying unit when a signal in the TD-SCDMA band is output therefrom.

12. The method of claim 9, wherein a matching path of the amplified signals of the high frequency band of the GSM quad band and the TD-SCDMA band are selectively controlled to be coupled to a matching circuit.

13. The method of claim 12, wherein the selecting is performed by controlling a matching circuit.

14. The method of claim 12, wherein controlling the matching circuit is performed by controlling a diode in the matching circuit.

15. The method of claim 9, wherein the low frequency band comprises frequency bands of 850 and 900 MHz of the GSM quad band.

16. The method of claim 9, wherein the high frequency band comprises frequency bands of 1800 and 1900 MHz of the GSM quad band, and frequency bands of 1880 MHz-1920 MHz and 2010 MHz-2025 MHz of the TD-SCDMA band.

17. A power amplifying apparatus of a mobile terminal, comprising:
 a plurality of input ports including a first input port for providing a signal of a low frequency band, and second and third input ports for providing a signal of a high frequency band;
 a first amplifying unit for amplifying a first signal of the low frequency band from the first input port;
 a second amplifying unit for amplifying a second signal of the high frequency band from the second or third input ports;
 a band switching unit for controlling a path between the second and third input ports and the second amplifying unit depending on detection of the second signal of the high frequency band on either the second input port or the third input port; and
 a Time Division-Synchronous Code Division Multiple Access (TD_SCDMA) control switching unit for selectively controlling a matching path between a signal in the high frequency band of the GSM quad band and a signal in the TD-SCDMA band;
 wherein the signal of the low frequency band comprises a signal of a low frequency band of a Global System for Mobile communication (GSM) quad band, and the signal of the high frequency band comprises a signal of a high frequency band of the GSM quad band and a signal of a TD-SCDMA band.

18. The power amplifying apparatus of claim 17, further comprising an antenna switching module for transmitting signal output from the first and second amplifying units.

* * * * *